United States Patent
Suenaga et al.

(10) Patent No.: US 9,484,511 B2
(45) Date of Patent: Nov. 1, 2016

(54) LIGHT EMITTING DEVICE AND METHOD FOR MANUFACTURING SAME

(71) Applicant: NICHIA CORPORATION, Anan-shi, Tokushima (JP)

(72) Inventors: Ryoma Suenaga, Anan (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/274,872

(22) Filed: May 12, 2014

(65) Prior Publication Data

US 2015/0325760 A1 Nov. 12, 2015

(30) Foreign Application Priority Data

May 13, 2013 (JP) ................................. 2013-101219

(51) Int. Cl.
| | |
|---|---|
| H01L 33/62 | (2010.01) |
| H01L 33/00 | (2010.01) |
| H01L 33/36 | (2010.01) |
| H01L 23/00 | (2006.01) |
| H01L 33/48 | (2010.01) |

(52) U.S. Cl.
CPC ............ *H01L 33/62* (2013.01); *H01L 24/96* (2013.01); *H01L 33/005* (2013.01); *H01L 33/36* (2013.01); *H01L 33/486* (2013.01); *H01L 33/0079* (2013.01); *H01L 33/0095* (2013.01); *H01L 2933/0066* (2013.01)

(58) Field of Classification Search
CPC . H01L 33/486; H01L 33/62; H01L 33/0079; H01L 33/20
See application file for complete search history.

(56) References Cited

U.S. PATENT DOCUMENTS

| | | | |
|---|---|---|---|
| 2007/0188963 A1 | 8/2007 | Saito et al. | |
| 2008/0029761 A1 | 2/2008 | Peng | |
| 2010/0140640 A1 | 6/2010 | Shimokawa et al. | |
| 2010/0148198 A1* | 6/2010 | Sugizaki | H01L 33/44 257/98 |
| 2010/0190280 A1 | 7/2010 | Horiuchi | |
| 2012/0061706 A1 | 3/2012 | Kamada | |
| 2012/0097972 A1 | 4/2012 | Sugizaki et al. | |
| 2013/0026518 A1 | 1/2013 | Suh et al. | |
| 2014/0008688 A1 | 1/2014 | Shimokawa et al. | |

FOREIGN PATENT DOCUMENTS

| | | |
|---|---|---|
| JP | 2008-235792 A | 10/2008 |
| JP | 2010-135693 A | 6/2010 |

(Continued)

OTHER PUBLICATIONS

Extended European Search Report of the corresponding European Application No. 14168051.2, dated Sep. 17, 2014.

*Primary Examiner* — Jerome Jackson, Jr.
*Assistant Examiner* — David Spalla
(74) *Attorney, Agent, or Firm* — Global IP Counselors, LLP

(57) ABSTRACT

A light emitting device includes a light emitting element, a terminal substrate and a fixing member. The light emitting element is a semiconductor laminate having a first semiconductor layer, a light emitting layer, and a second semiconductor layer that are laminated in that order, a first electrode connected to the first semiconductor layer, and a second electrode connected to the second semiconductor layer. The terminal substrate includes a pair of terminals connected to the first electrode and the second electrode, and an insulator layer that fixes the terminals. At least a part of the outer edges of the terminal substrate is disposed more to a center of the light emitting device than the outer edges of the semiconductor laminate. The fixing member fixes the light emitting element and the terminal substrate.

19 Claims, 8 Drawing Sheets

(56) References Cited

FOREIGN PATENT DOCUMENTS

| | | |
|---|---|---|
| JP | 2010-141176 A | 6/2010 |
| JP | 2010-177225 A | 8/2010 |
| JP | 2010-199565 A | 9/2010 |
| JP | 2011-009572 A | 1/2011 |
| JP | 2011-066193 A | 3/2011 |
| JP | 2012-080085 A | 4/2012 |
| JP | 02012080085 A * | 4/2012 ............ H01L 33/48 |
| WO | 2012-077884 A1 | 6/2012 |
| WO | WO 2012077884 A1 * | 6/2012 ........... H01L 33/005 |

* cited by examiner

LIGHT EMITTING DEVICE AND METHOD FOR MANUFACTURING SAME

CROSS-REFERENCE TO RELATED APPLICATIONS

This application claims priority to Japanese Patent Application No. 2013-101219 filed on May 13, 2013. The entire disclosure of Japanese Patent Application No. 2013-101219 is hereby incorporated herein by reference.

BACKGROUND

1. Technical Field

The present disclosure relates to a light emitting device and a method for manufacturing the same.

2. Related Art

The output, brightness, and so forth of light emitting diodes have been increased in recent years by improving the crystal quality of these devices, etc. As a result, in addition to various uses in the field of general lighting, the field of automotive lighting and the like, there have been proposals for making these devices smaller and higher in quality.

In view of this, light emitting devices with an integrated circuit board have been proposed as a surface mount type of light emitting device, and various methods have been proposed that allow such a light emitting device to be assembled simply (see JP2010-199565A, JP2010-177225A, etc.)

These conventional light emitting devices has been formed by a method in which a plurality of light emitting elements of a wafer unit are integrally arranged, and in this state are mounted all at once on a mounting board having a plurality of units corresponding to a single light emitting device, and then diced. Alternatively, a method is employed in which chips are mounted all at once on a mounting board having a plurality of units corresponding to a single light emitting device, and then diced.

There is a need for light emitting devices to be made even more compact, thinner, and brighter. In addition to enhancing these characteristics, there is also a need for a light emitting device that is easier to handle and less expensive.

SUMMARY

In one embodiment, the present disclosure relates to a light emitting device having:
a light emitting element including:
a semiconductor laminate in which a first semiconductor layer, a light emitting layer, and a second semiconductor layer are laminated in that order;
a first electrode connected to the first semiconductor layer and
a second electrode connected to the second semiconductor layer;
a terminal substrate including:
a pair of terminals connected to the first electrode and the second electrode, and
an insulator layer that fixes the terminals,
at least a part of the outer edges of the terminal substrate being disposed more to an inside than the outer edges of the semiconductor laminate; and
a fixing member fixing the light emitting element and the terminal substrate.

In other embodiment, the present disclosure relates to a method of manufacturing a light emitting device includes:
mounting a terminal substrate on a light emitting element including the semiconductor laminate so that at least a part of the outer edge of the terminal substrate is disposed more to the inside than the outer edge of the light emitting element in plan view.

In still other embodiment, the present disclosure relates to a method of manufacturing a light emitting device includes:
arranging on a support a plurality of semiconductor laminates in which a first semiconductor layer, a light emitting layer and a second semiconductor layer are laminated in that order, and which have a first electrode connected to the first semiconductor layer and a second electrode connected to the second semiconductor layer on one side; and
mounting a terminal substrate on each of the semiconductor laminates arranged on the support so that the outer edge of the terminal substrate is disposed more to the inside than the outer edge of the semiconductor laminates in plan view.

In further still other embodiment, the present disclosure relates to a light emitting device including:
a semiconductor laminate including a first semiconductor layer, a light emitting layer, and a second semiconductor layer are laminated in that order,
the semiconductor laminate having a plurality of outer edges,
a first electrode connected to the first semiconductor layer, and
a second electrode connected to the second semiconductor layer;
a terminal substrate including:
a pair of terminals including a first terminal and a second terminal,
the first terminal connected to the first electrode,
the second terminal connected to the second electrode,
an insulator layer that fixes the terminals, and
a plurality of outer edges;
a fixing member fixing the light emitting element and the terminal substrate; and
a portion of the outer edges of the terminal substrate are disposed closer to a center of the light emitting device than the outer edges of the semiconductor laminate when viewed in a plan view.

The present disclosure relates to a method of manufacturing a light emitting device including:
mounting a terminal substrate on a light emitting element,
the terminal substrate having a plurality of outer edges,
the light emitting element including a semiconductor laminate and an outer edge;
the mounting the terminal substrate on the light emitting element such that a portion of the outer edges of the terminal substrate is disposed closer to a center of the light emitting device than the outer edge of the light emitting element when viewed in a plan view.

The present disclosure relates to a method of manufacturing a light emitting device including:
preparing light emitting elements including semiconductor layer in which a first semiconductor layer, a light emitting layer and a second semiconductor layer are laminated in that order, a first electrode connected to the first semiconductor layer, and a second electrode connected to the second semiconductor layer on one side;
arranging a plurality of light emitting elements on a support;
mounting a terminal substrate on each of the light emitting elements such that an outer edge of the terminal substrate is disposed closer to a center of the semiconductor laminate than an outer edge of the light emitting element when viewed in a plan view.

DETAILED DESCRIPTION OF EMBODIMENTS

Figure 1A:
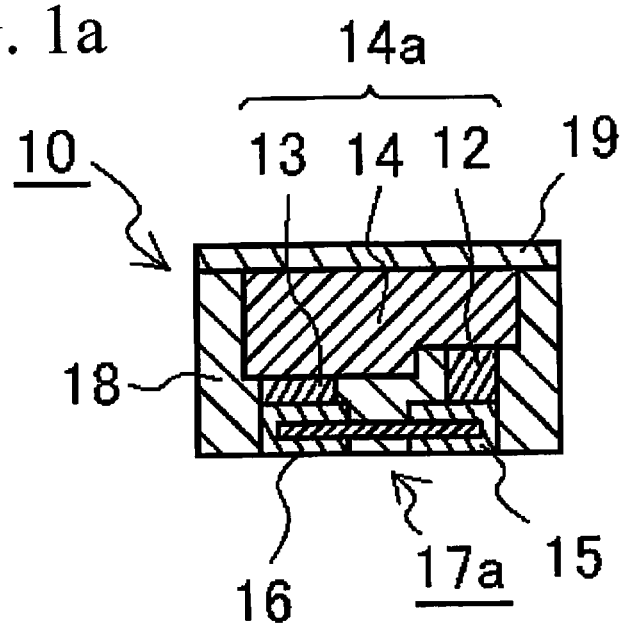
FIG. 1A consists of a simplified cross section and FIG. 1B consists of a bottom view of an embodiment of the light emitting device of the present disclosure.

The present invention was conceived in light of the above problem, and it is an object thereof to provide a light emitting device which is easy to handle, and which can be provided less expensively by improving mass production, in addition to reducing the size and thickness, increasing the brightness, and enhancing other such characteristics, as well as a method for manufacturing this device.

Terms indicating a specific direction or position are used as required in the following description (for example, "above", "below", "right", "left", and other terms including those terms). However, these terms are for the purpose of facilitating comprehension of the invention by reference to the figures, and do not limit the technical scope of the invention as a result of the meaning of these terms. Further, in the description below, the same designations or the same reference numerals may, in principle, denote the same or like members and duplicative descriptions will be appropriately omitted. To facilitate an understanding of the invention, its embodiments will be described separately, but these embodiments are not independent from one another, and where they can be shared in common, descriptions of other embodiments are applicable.

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

A light emitting device according to the present embodiment includes a light emitting element, i.e., a semiconductor laminate and a terminal substrate. The light emitting device may also include a fixing member. One or more semiconductor laminates are included in a single light emitting device here. This light emitting device can be either what is known as a top view type or a side view type.

Light Emitting Element

A light emitting element generally includes a semiconductor laminate, the first electrode and the second electrode.

Semiconductor Laminate

The semiconductor laminate of the present embodiment is produced by laminating a first semiconductor layer (such as an n-type semiconductor layer), a light emitting layer, and a second semiconductor layer (such as a p-type semiconductor layer), in that order. On one side (also referred to as the second semiconductor layer side or the lower face side, for example) of the semiconductor laminate, a first electrode that is connected to the first semiconductor layer, and a second electrode that is connected to the second semiconductor layer are disposed. A light extraction face, where light is emitted from the semiconductor laminate, is on the other side of the semiconductor laminate, that is, on the opposite side from the one side mentioned above. The semiconductor laminate is laminated over a substrate used for growing a semiconductor layer, and may retain this substrate, or the substrate may be removed.

There are no particular restrictions on the kind and material of the first semiconductor layer, the light emitting layer and the second semiconductor layer, for example, examples thereof include various semiconductor such as a III-V compound semiconductor, a II-V compound semiconductor. More specifically, examples thereof include a gallium nitride-based semiconductor material such as $In_XAl_YGa_{1-X-Y}N$ ($0 \leq X$, $0 \leq Y$, $X+Y \leq 1$), InN AlN, GaN, InGaN, AlGaN, InGaAlN, and the like can be used. A known a thickness or a laminated structure of each layer in the art can be used.

The substrate may be one which can be grown semiconductor layers. Examples of the material for the substrate include an insulating substrate such as sapphire ($Al_2O_3$) and spinel ($MgAl_2O_4$) and the like, and a semiconductor substrate such as the nitride semiconductor described above. When a transparent substrate such as sapphire is used for the substrate used for growing a semiconductor layer, the substrate may be employed in the light emitting device without removing from the semiconductor laminate.

Among these, the substrate which has a main surface of any one of C plane, A plane, R plane, M plane is preferable. The substrate which has A plane or C plane as an orientation flat plane is more preferable. In particular, a sapphire substrate which has C plane (0001) as the main surface and A plane (11-20) of the orientation flat plane is still more preferable.

The substrate may have convex surfaces and concave surfaces on its surface. The surface of the substrate may have an off angle of about 0 to 10° with respect to a predetermined crystalline surface such as C plane or A plane. The substrate may have at least one semiconductor layer such as an intermediate layer, buffering layer, underlying layer, and the like, or at least one insulating layer between the substrate and the first semiconductor layer.

If the substrate used for growing a semiconductor layer is removed from the semiconductor laminate, the resulting light emitting device will be thinner and more compact. Also, removing any layers that do not contribute directly to light emission prevents the light emitted from the light emitting layer from being absorbed by these layers, so emission efficiency can be increased. As a result, brighter light can be emitted.

There are no particular restrictions on the shape of the semiconductor laminate in plan view, but a shape that is quadrangle or a similar shape is preferable. The upper limit to the size of the semiconductor laminate can be suitably adjusted according to the size of the light emitting device. More specifically, an example of the length of the semiconductor laminate along one side is from a few hundred microns to about 10 mm.

When the semiconductor laminate retains the substrate used for growing the semiconductor layer, the shapes of the semiconductor laminate and the substrate in plan view may be the same, or may be different to each other, that is, part of the surface of the substrate may be exposed from the semiconductor laminate for easy separation of each the semiconductor laminate.

First Electrode and Second Electrode

The first electrode and second electrode are formed on one side of the semiconductor laminate (if there is a substrate, the opposite side from the side on which the substrate is located).

The first electrode and second electrode can be formed by a single-layer film or a laminate film of Al, Ag, Au, Pt, Pd, Rh, Ni, W, Mo, Cr, Ti or another such metal or an alloy of such metals. More specifically, it can be formed by a laminate film in which AlSiCu/Ti/Pt/Au, Ti/Rh/Au, W/Pt/Au, Rh/Pt/Au, Ni/Pt/Au or Ti/Rh are laminated in that order starting from the semiconductor layer side. The film thickness may be the thickness of any film used in this field. Also, a conductive material other than a metal, such as ITO, may be used.

The first electrode and second electrode are preferably such that a material layer whose reflectivity to light emitted from the light emitting layer is higher than that of the other material of the electrodes is disposed as part of these electrodes on the side closer to the first semiconductor layer and the second semiconductor layer.

An example of a material with high reflectivity is a layer of silver, a silver alloy, or containing aluminum. The silver alloy may be any material that is known in this field. There are no particular restrictions on the thickness of this material layer, but an example is a thickness that allows the light emitted from the light emitting element to be effectively reflected, such as about 20 nm to 1 p.m. The greater is the contact surface area of this material layer with the first semiconductor layer or the second semiconductor layer, the better.

When silver or a silver alloy is used, the surface thereof (preferably the top face or side faces) is preferably covered with a cover layer in order to prevent the migration of the silver.

This cover layer is normally one formed by a metal or alloy that is used as a single-layer film or a laminate film including a conductive material such Al, Cu, Ni or another such metal. Among these, AlCu is particularly favorable. The thickness of the cover layer may be from a few hundred nanometers to a few microns, in order to effectively prevent the migration of silver.

As long as the first electrode and second electrode are connected to the first semiconductor layer and second semiconductor layer, respectively, the entire surface of the electrodes need not be touching the semiconductor layer, and part of the first electrode may not be disposed on the first semiconductor layer and/or part of the second electrode may not be disposed on the second semiconductor layer. That is, the first electrode may be disposed on the second semiconductor layer, and the second electrode may be disposed on the first semiconductor layer, via an insulating film or the like.

There are no particular restrictions on the insulating film, which may be any single-layer film or laminated film that is used in this field.

The first electrode and second electrode can be set to the desired size and position, regardless of the surface area of the first semiconductor layer and/or the second semiconductor layer, by using the above-mentioned insulating film or the like. Accordingly, mounting a terminal substrate (discussed below) to a semiconductor laminate can be easy even when the terminal substrate has a surface area that is smaller than the surface area of the semiconductor laminate.

The shape of the first electrode and second electrode can be set according to the shape of the semiconductor laminate, the shape of the terminals on the terminal substrate, and so forth. For instance, the first electrode and second electrode preferably have shapes that correspond to the terminals (hereinafter also referred to as "junction terminals"; an example is a quadrangle shape or a shape close to quadrangle) of the terminal substrate joined to the first electrode and second electrode (discussed below). The first electrode and second electrode and the junction terminals preferably have a shape that is quadrangle or close to quadrangle. Consequently, a self-alignment effect allows for easy positioning and joining of the semiconductor laminate and the terminal substrate. In this case, it is preferable if the planar shapes of the first electrode and second electrode are substantially the same at least at the outermost surface of the semiconductor laminate connected to the terminal substrate (discussed below). It is also preferable if the first electrode and second electrode are disposed so as to face each other, with the center portion of the semiconductor laminate in between in plan view.

The top faces of the first electrode and second electrode (the faces on the opposite side from the semiconductor layer) may have a step, but are preferably substantially flat. The term "flat" here means that the height from the face of the semiconductor laminate that is on the opposite side from the side that touches the light emitting layer of the first semiconductor layer to the surface of the first electrode (the face of the first electrode on the opposite side form the semiconductor laminate), and the height from the face of the semiconductor laminate that is on the opposite side from the side that touches the light emitting layer of the first semiconductor layer to the surface of the second electrode are substantially the same. The phrase "substantially the same" here encompasses fluctuation of about ±10% in the height of the semiconductor laminate.

The terminal substrate (discussed below) will be easier to mount horizontally if the top faces of the first electrode and second electrode are substantially flat, that is, substantially in the same plane. In order to form the first electrode and second electrode in this way, for example, a metal film is provided by plating or the like over the electrodes, after which this is polished or cut so that the surfaces lie in substantially the same plane.

The first electrode and second electrode may have protrusion portions on their surfaces, respectively. The protrusion portion is preferably disposed at a region connected to a terminal of a terminal substrate. This allow to be easily filled a space between the light emitting element and the terminal substrate with a fixing member when the fixing member is formed in the space between the light emitting element and the terminal substrate. Thus, the transmission of the light emitted from the light emitting element to a side of the terminal substrate can be reduced. Further, the reliability of the light emitting device is enhanced by disposing these protrusion portions and strongly-supporting the light emitting element to the terminal substrate.

The shape of the upper surface of the protrusion portion formed on the first electrode or the second electrode of the light emitting element is preferably the same or substantially the same as the shape in the plan view of a portion to which the light emitting element is connected. This enables to be easily mounted the light emitting element on the terminal substrate at the proper site by a self-alignment effect.

The protrusion portion has any height from the upper surface of the first electrode or the second electrode in which the protrusion portion is not disposed, and the height of the protrusion portion is preferably set to a few micro meters to 100 micro meters.

A DBR (distributed Bragg reflector) may be disposed between the first electrode and second electrode and their respective first semiconductor layer and second semiconductor layer, to the extent that this does not impair electrical connection of these.

A DBR is a multilayer structure in which a low refractive index layer and a high refractive index layer are laminated over an under layer composed of an oxide film or the like, as needed, and selectively reflects light of a specific wavelength. More specifically, a specific wavelength can be reflected very efficiently by alternately laminating films of different refractive indexes at a quarter-wave thickness. The DBR can be formed of layers including at least one oxide film or nitride film selected from Si, Ti, Zr, Nb, Ta, Al or the like.

For example, the low refractive index layer can be $SiO_2$, and the high refractive index layer can be $Nb_2O_5$, $TiO_2$, $ZrO_2$, $Ta_2O_5$, or the like. More specifically, $(Nb_2O_5/SiO_2)_n$ (where n is 2 to 5) may be laminated in order starting from the under layer side. The total thickness of the DBR is preferably about 0.2 to 1 µm.

This DBR may be used as the above-mentioned insulating film. This improves the light extraction efficiency of the light emitting device.

When a growth substrate is removed by laser irradiation (discussed below), a material whose light absorbency is no more than 30% of the wavelength of the laser being used is preferably used as the material of the DBR. This reduces degradation of the DBR and allows the light extraction efficiency to be kept high. For example, when a KrF excimer laser with a wavelength of 248 nm is used, it is preferable to use $ZrO_2$ rather than $Nb_2O_5$, $TiO_2$, or the like.

Terminal Substrate

The terminal substrate includes a pair of terminals that are connected respectively to the first electrode and second electrode of the above-mentioned semiconductor laminate (i.e., light emitting element) and that are also connected to the outside of the light emitting device, and an insulator layer that fixes these terminals. However, if a plurality of semiconductor laminates are included in a single light emitting device, the terminal substrate may further include one or more sets of wiring capable of functioning as connection wiring that electrically connects the plurality of semiconductor laminates. In addition to electrically connected terminals or wiring, there may also be heat dissipation-use terminals, a heat sink, or the like.

In this Specification, the face of the terminal substrate on the side where the semiconductor laminate is mounted is called the element junction face or a first face, the face on the opposite side from the element junction face is called the rear face or a second face, and the face or faces in between the element junction face and the rear face, or the face that links these, is called a side face.

Insulator Layer

The insulator layer may be made from any material so long as it is insulating. Examples include ceramics, resin, dielectrics, pulp, glass, composites of these materials, and composites of these materials and a conductor material (such as a metal or carbon). A ceramic is particularly favorable. When a ceramic is used for the insulator layer, it can be procured at lower cost by applying technology for manufacturing small chip resistors. The ceramic preferably makes use of aluminum nitride or another such material with high heat dissipation properties. Further, a prepreg substrate formed of a glass epoxy resin, a grass silicone resin or a glass modified silicone resin, which has a relatively low linear coefficient of expansion, is preferable. For example, a glass epoxy substrate, having a low linear coefficient of expansion, which is adjusted to 1 to 15 ppm of linear coefficient of expansion by highly filling with glass fiber cloth or filler used in the field of BGA mounting for the semiconductor device is preferably used. Such insulator layer on which conductive wiring patterns is formed is preferably used as the terminal substrate. If the glass fiber cloth or filler having a high heat dissipation is used for the material of the prepreg substrate, heat dissipation of the light emitting device can be enhanced.

Also, if a built-in component is built into the insulator layer, the insulator layer can be served as a protection element and the like.

Terminals

At least on an element junction face of the terminal substrate, the terminals have junction terminals that are connected to the first electrode and second electrode of the light emitting element, and external connectors that is provided to other face of the terminal substrate and is connected to the outside of the light emitting device.

Figure 7:
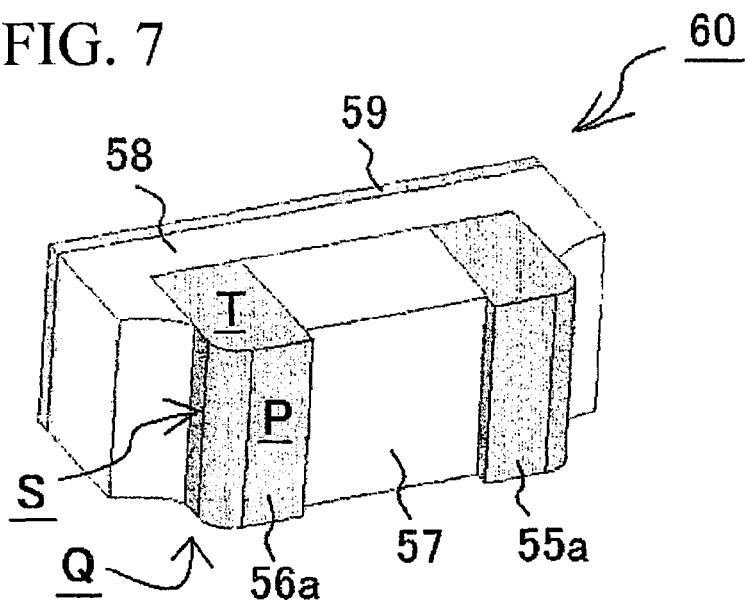
FIG. 7 is a simplified oblique view of yet another embodiment of the light emitting device of the present invention.

There are no particular restrictions on the position and so forth of the terminals inside the terminal substrate, but as an example, the junction terminals are disposed at positions opposite the first electrode and second electrode, respectively, of the light emitting element, and may extend from there so as to cover the side faces of the terminal substrate, or they may extend from the element junction face of the terminal substrate so as to cover the side faces and the faces on the opposite side of the element junction face (rear face) (see the terminals 15 and 16 in FIG. 1A), or they may extend so as to cover the three side faces that are continuous with the element junction face of the terminal substrate (see 55a and 56a in FIG. 7). Also, the terminals may extend from the element junction face of the terminal substrate to the face where the external connectors are provided via so-called via holes, and not via the side faces. The external connectors are connected to the outside of the light emitting device, so they are exposed from a fixing member, etc. The external connectors may be on either the rear face or a side face of the terminal substrate.

There are no particular restrictions on the material of the terminals, so long as it has good conductivity and affords good mounting, but a material with good wettability and bondability with the solder on the mounting side or the joining member is preferable. Examples of the material include a laminating structure such as W/Ni/Au, W/Ni/Pd/Au, W/NiCo/Pd/Au and the like when the insulator layer is formed from ceramics and the like, and a laminating structure such as Cu/Ni/Au, Cu/Ni/Au, Cu/Ni/Pd/Au, Cu/NiCu/Ni/Au, Cu/Ni/Pd/Cu/Ni/Pd/Au and the like when the insulator layer is formed from glass eposy resin and the like. The above-mentioned conductive material used in the first electrode and second electrode also can be used.

The wiring that can function as connection wiring may be on the element junction face of the terminal substrate. The number of wires and the shape, position, and so forth of this wiring can be suitably set according to the number of semiconductor laminates to be mounted on a single terminal substrate, the layout thereof, the connection mode (parallel or serial), and so forth.

A method for producing the terminals and wiring can be selected according to the material for the insulator layer, size of the light emitting device and the like. Plating, deposition, printing and the like are suitably used. Further, the insulator of the resin and metal terminals embedded and fixed in the insulator are formed as the terminal substrate by, for example, bending a metal plate having a high heat dissipation such as Mg to the intended shape of terminal or wiring, forming the insulating material such as the resin including inorganic filler around the metal plate, and then shaping through cutting or severing.

The terminals or wires are preferably substantially flat on their element junction face side. Also, the terminals or wires are preferably substantially flat at the element junction face of the terminal substrate. Furthermore, the terminals or wires are preferably horizontal at the element junction face of the terminal substrate so that when the above-mentioned semiconductor laminate and the terminal substrate are joined, the face of the semiconductor laminate on the side where the first electrode and second electrode are not formed (that is, the light extraction face) can be disposed horizontally. This simplifies the process of exposing the rear face side of the terminal substrate by removing the fixing member (discussed below).

The terminals or wires may have protrusion portions on their surfaces, respectively. The protrusion portion is preferably disposed at a region connected to the first electrode and the second electrode of the light emitting element. This allow to be easily filled a space between the light emitting element and the terminal substrate with a fixing member when the fixing member is formed in the space between the light emitting element and the terminal substrate. Thus, the transmission of the light emitted from the light emitting element to a side of the terminal substrate can be reduced. Further, the reliability of the light emitting device is enhanced by disposing these protrusion portions and strongly-supporting the light emitting element to the terminal substrate.

The shape of the upper surface of the protrusion portion is preferably the same or substantially the same as the shape in the plan view of the first electrode or the second electrode of the light emitting element to be connected. This enables to be easily mounted the light emitting element on the terminal substrate at the proper site by a self-alignment effect.

The protrusion portion can be formed by disposing a bump on a flat terminals or wires, disposing the insulator having a different thickness under which the terminals or wires are formed, disposing the terminals or wires having a different thickness on a flat insulator, or by combination thereof.

The protrusion portion has any height from the upper surface of the terminals or wires in which the protrusion portion is not disposed, and the height of the protrusion portion is preferably set to a few micro meters to 100 micro meters.

There are no particular restrictions on the planar shape of the terminal substrate, which can be suitably set according to the shape of the semiconductor laminate or the light emitting device. Examples of the planar shape include circular, quadrangle and other such polyhedral shapes, and shapes close to these. Nor are there any particular restrictions on the size, but the surface area is preferably substantially equal to, or less than, or greater than that of the semiconductor laminate. In particular, when a single light emitting device includes a single semiconductor laminate, the surface area of the terminal substrate is preferably substantially equal to or less than that of the semiconductor laminate. When a single light emitting device includes two or more semiconductor laminates, the terminal substrate preferably has a surface area that is substantially equal to or less than the combined surface area of the two or more semiconductor laminates.

The terminal substrate is preferably disposed so that its outer edges are more to the inside than a portion of the outer edges of the semiconductor laminate in plan view. In other words, a portion of the outer edges of the terminal substrate are disposed closer to a center of the light emitting device than the outer edges of the semiconductor laminate when viewed in a plan view. The "outer edge" here may be the entire edge, or just a part of it.

For example, it is preferable if the entire outer edge of the terminal substrate is disposed more to the inside than the outer edge of the semiconductor laminate. This affords a more compact light emitting device.

Also, if the terminal substrate and the semiconductor laminate are quadrangle or close to being quadrangle in plan view, the outer edge of the terminal substrate may be disposed at the same position as the outer edge of the semiconductor laminate along at least one side, and the outer edge of the terminal substrate may be disposed more to the inside than the outer edge of the semiconductor laminate along the remaining sides.

Thus, light will be less likely to shine on the terminal substrate if the surface area of the terminal substrate is made smaller than the surface area of the semiconductor laminate, or if the outer edge of the terminal substrate is disposed more to the inside than the outer edge of the semiconductor laminate. This reduces the absorption of light by the terminal substrate, and affords a light emitting device with higher light extraction efficiency.

When the light emitting device is a side view type, it is preferably provided so as to expose the terminals at the bottom face of the terminal substrate that will be the mounting face. Also, the bottom face of the terminal substrate (that is the face on the opposite side from the face opposite to the semiconductor laminate, the rear face, or the second face), and one or two faces of the terminal substrate adjacent to the bottom face are preferably exposed. Furthermore, the terminals may be exposed at the face on the opposite side from the mounting face of the light emitting device.

There are no particular restrictions on the thickness of the terminal substrate, but the thickness preferably is sufficient to prevent breaking, chipping, etc., during handling of the semiconductor laminate, or to allow the semiconductor laminate to be reinforced in the light emitting device. An example is a range of about 50 to 300 μM.

The terminal substrate may itself constitute a capacitor, a varistor, a Zener diode, a bridge diode, or another such protective element, or it may partially include a structure that provides the functions of these elements. If a terminal substrate that has these element functions is used, the light emitting device will be able to function without any special parts being mounted, so a high-performance light emitting device with enhanced electrostatic withstand voltage can be made more compact.

The junction terminals of the terminal substrate are usually joined by junction members to the first electrode and second electrode of the semiconductor laminate. These junction members can be made from any material known in this field. Examples of the junction member include, for example, Au—Sn, Sn—Cu and other eutectic alloys (for example, solder), bump, anisotropic conductive material, and the like. If the eutectic alloy is used, a self-alignment effect will allow the terminal substrate to be easily mounted at the proper site, which improves mass production and allows a more compact light emitting device to be manufactured.

Fixing Member

The light emitting device of the present embodiment may further include a fixing member. A fixing member is a member having the function of covering or fixing the terminal substrate and/or the semiconductor laminate constituting the above-mentioned light emitting device. There are no particular restrictions on the material of the fixing member so long as it serves such function, examples thereof include ceramics, resin, dielectrics, pulp, glass or the its complex material. Among these, a resin is preferable from the standpoint of being able to easily form the desired shape.

Examples of the resin include a thermosetting resin and a thermoplastic resin. Specific Examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition, polyphthalamide (PPA), a polycarbonate resin; a polyphenylene sulfide (PPS); a liquid crystal polymer (LCP); an ABS resin (an acrylonitrile-butadiene-styrene resin); a phenolic resin; an acrylic resin; and a PBT resin (polybutylene terephthalate resin).

The resin may contain a light reflecting material so that its reflectivity of light from the light emitting element will be at least 60%, and preferably at least, 70%, 80%, or 90%. Examples of the light reflecting material include titanium dioxide, silicon dioxide, zirconium dioxide, potassium titanate, alumina, aluminum nitride, boron nitride, mullite, niobium oxide, various rare earth oxides (e.g., yttrium oxide, gadolinium oxide, etc.). This allows the light from the light emitting element to be reflected efficiently. In particular, when a material whose optical reflectivity is higher than that of the terminal substrate is used (for example, when aluminum nitride is used for the terminal substrate, a silicone resin containing titanium oxide is used as a fixing member), good handling properties will be maintained while the size of the terminal substrate can be reduced, and the light extraction efficiency of the light emitting device can be enhanced.

The resin may contain a light scattering material such as barium sulfate, titanium dioxide, aluminum oxide, and silicon oxide, colorants such as carbon black, and the like. The resin may also contain a fibrous filler such as glass fibers, wollastonite, an inorganic filler such as carbon, silicon oxide or the like. The resin may contain a material having a high heat dissipation such as aluminum nitride and the like. For example, when titanium dioxide is used, it is preferably to contain 20 to 40 weight % with respect to the total weight of the resin member.

If such a component is contained, and the inorganic filler content is further increased, or a resin with high strength is used, the strength of the fixing member can be increased in processes such as removing or peeling off a substrate, support, etc., and this ensures good strength in the light emitting device as well. Also, if a material with good heat dissipation properties is contained, heat dissipation can be enhanced while maintaining the small size of the light emitting device.

The fixing member is preferably (1) disposed so as to cover the side faces of the terminal substrate, (2) disposed so as to cover the side faces of the semiconductor laminate, and/or (3) disposed so as to fill in the space between the semiconductor laminate and the terminal substrate. It is especially preferable for them to be disposed so as to satisfy all of (1) to (3) above. When the semiconductor laminate retains the substrate used for growing the semiconductor layer, the fixing member is preferably disposed so as to cover the side faces of the substrate. When part of the surface of the substrate is exposed from the semiconductor laminate, the fixing member is preferably disposed so as to cover the side faces of the substrate. Thus disposing the fixing member ensures that the light emitting device will have good strength, and this makes the device easier to handle. Also, as discussed above, the semiconductor laminate will be strong enough to withstand the stress exerted on it when the substrate used for growing a semiconductor layer is removed, and a compact light emitting device can be manufactured at a high yield. In other words, a compact light emitting device can be mass-produced better. As a result, light emitting devices in which high quality is ensured individually can be obtained.

The fixing member preferably exposes the second face of the terminal substrate. This improves heat dissipation.

Also, when the fixing member is disposed so as to satisfy (1) to (3) above, it is preferable to use a fixing member with high reflectivity. This allows a higher light extraction to the top face of the semiconductor laminate to be effectively achieved.

Here, the width of the fixing member that covers the side faces of the terminal substrate and/or the side faces of the semiconductor laminate (the height from the side faces of the terminal substrate or the semiconductor laminate) can be suitably set according to the planar shape of the terminal substrate and/or the semiconductor laminate, but an example is about 20 to 200 μm. A thickness such as this will allow the light emitted from the above-mentioned light emitting element to be reflected effectively, and allow adequate strength to be imparted to the semiconductor laminate.

Wavelength Conversion Member

A wavelength conversion member is preferably provided to the light extraction face of the light emitting device. For example, the light extraction face of the semiconductor laminate is preferably covered by the wavelength conversion member. If the side faces of the semiconductor layer constituting the semiconductor laminate of the light emitting device are covered by and in contact with the fixing member, it is more preferable if the fixing member is also covered by the wavelength conversion member, in addition to the light extraction face of the semiconductor laminate. This disposition of the wavelength conversion member allows the wavelength of light extraction from the semiconductor laminate to be efficiently converted.

The wavelength conversion member is mainly formed by a fluorescent material. The fluorescent material contained in the wavelength conversion member may be any material that is known in this field. Examples of the fluorescent material includes a YAG-based fluorescent material and a LAG-based fluorescent material which absorb blue light and emit yellow to green light, a SiAlON-based fluorescent material (β-sialon-based fluorescent material) which emits to green light, a SCASN-based fluorescent material and a CASN-based fluorescent material which emit red light can be used singly or in combination thereof.

The wavelength conversion member may be one that contains only a fluorescent material, but preferably includes alumina, silicon oxide, or another such translucent inorganic material, a light-transmissive resin, or the like as a binder. Using a binder allows the wavelength conversion member to be easily disposed in any position desired.

The light-transmissive resin allows penetration of light, which is 60% or greater of light emitted from the light emitting layer, and further preferably allows penetration of 70% or greater, 80% or greater, or 90% or greater of light emitted from the light emitting layer. Examples of such resin include a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

A method for manufacturing the wavelength conversion member is a same method as the covering method of the fixing member (described below), a method by forming a sheet of the wavelength conversion member and attaching it, electrophoretic deposition, potting, compression molding, electrostatic coating, and the like.

There are no particular restrictions on the thickness or shape of the wavelength conversion member, but a layer of about 10 to 300 μm is an example.

Instead of a wavelength conversion member, a sealing member that contains no fluorescent material may be formed from the above-mentioned translucent resin.

The sealing member may contain one of the above-mentioned light scattering materials, inorganic fillers, etc.

The wavelength conversion member, a layer contains light scattering material, and or sealing member may be laminated in two or more kinds. For instance, the sealing member may be laminated to the semiconductor laminate and the wavelength conversion member provided over this.

Method for Manufacturing Light Emitting Device

The method for manufacturing the light emitting device of the present embodiment includes mounting a terminal substrate on a light emitting element including the semiconductor laminate so that at least a part of the outer edge of the terminal substrate is disposed more to the inside than the outer edge of the light emitting element in plan view. In other words, the mounting the terminal substrate on the light emitting element such that a portion of the outer edges of the terminal substrate is disposed closer to a center of the light emitting device than the outer edge of the light emitting element when viewed in a plan view.

In one embodiment, the method for manufacturing the light emitting device of the present embodiment includes the steps of:

(1) Arranging a plurality of light emitting elements on a support. For example, this can be semiconductor laminates in which a first semiconductor layer, a light emitting layer and a second semiconductor layer are laminated in that order, and which have a first electrode connected to the first semiconductor layer and a second electrode connected to the second semiconductor layer on one side.

(2) Mounting a terminal substrate on each of the semiconductor laminates arranged on the support, so that the outer edge is disposed more to the inside than the outer edge of the semiconductor laminates when viewed in a plan view.

This method may also include one or more of the following steps:

(3) fixing a plurality of terminal substrates and a plurality of semiconductor laminates with the fixing member;

(4) removing the support from the semiconductor laminates; and (5) separating (for example, cutting) the fixing members between the semiconductor laminates at every one or more semiconductor laminates.

The above-mentioned step (3) may include, for example:

(a) covering the side faces of the terminal substrate with the fixing member;

(b) covering the side faces of the semiconductor laminates with the fixing member; and/or (c) covering a space between the semiconductor laminates and the terminal substrate with the fixing member.

First, in step (1), the light emitting element is formed. In other words, the semiconductor laminate is formed.

The semiconductor laminate can be formed on a substrate by suitably adjusting the conditions, etc., in order to obtain the above-mentioned layer structure of the semiconductor laminate, by any method ordinarily used in this field. Examples of the method include MOVPE (Metal Organic Vapor Phase Epitaxy), MOCVD (Metal Organic Chemical Vapor Deposition), HYPE (Hydride Vapor Phase Epitaxy), MBE (Molecular Beam Epitaxy), and various other film formation methods.

For example, a buffer layer of AlGaN, a first semiconductor layer of n-type GaN, a light emitting layer including an InGaN layer, and a second semiconductor layer of p-type GaN are laminated by MOCVD on a sapphire substrate to form the layer structure of the semiconductor layer.

After this, part (in the thickness direction) of the second semiconductor layer and the light emitting layer and, if needed, the first semiconductor layer, of the resulting layer structure of the semiconductor layers is removed by RIE or other such etching to expose the first semiconductor layer. A first electrode and a second electrode that respectively connected to the first semiconductor layer and the second semiconductor layer are formed on the surface of the exposed first semiconductor layer and the surface of the second semiconductor layer.

The semiconductor laminate obtained in this manner is diced into individual pieces, each unit of which constitutes one light emitting device. To simplify this dicing, during or after step (1), a portion of the first semiconductor layer, the light emitting layer, and the second semiconductor layer are preferably removed at the positions where dicing is intended, thereby exposing the substrate surface (this is also called element separation). Damage to the semiconductor layers can be prevented by cutting at the places where the substrate surface is exposed. This improves mass production. Also, since this provides a spacing between the semiconductor laminates, the terminal substrate can be easily mounted even when using a terminal substrate that is as large as or larger than the outer edge of the semiconductor laminate.

Here, if one chip is installed on one light emitting device, the cutting is done for each unit that has undergone element separation, but if a plurality of chips are mounted on one light emitting device, the cutting may be done for two or more units that have undergone element separation.

A plurality of the resulting semiconductor laminates of each unit are arranged on a support.

There are no particular restrictions on this support, as long as it is board shape which allows semiconductor laminates to be disposed on it. The arrangement of semiconductor laminates may be random, but a regular layout (such as a matrix) is preferable. The arrangement is preferably such that the semiconductor laminates will not readily change position when affixed with adhesive tape or the like.

Alternatively, after the resulting semiconductor laminates have undergone element separation, the flow may proceed directly to the next step in a state in which a plurality of semiconductor laminates have been arranged on the substrate. If the flow moves to the next step in this state, there will be no need to make a plurality of arrangements or cut the substrate as discussed above, and the individual units will not change position, which is suited to mass production. The support in this case is a substrate used to grow the semiconductor layers.

In step (2), the terminal substrate is mounted to each of the semiconductor laminates arranged on the support, so that the outer edge of the terminal substrate will be arranged more to the inside than the outer edge of the semiconductor laminate in plan view.

The mounting of the terminal substrates here may be accomplished by disposing terminal substrates over the semiconductor laminates arranged on supports, respectively, or by aligning a plurality of terminal substrates on an adhesive tape or the like and transferring/disposing them all at once on semiconductor laminates arranged on a support.

The mounting of the terminal substrate is preferably accomplished by utilizing the above-mentioned self-alignment effect. This effect allows a terminal substrate that is either the same size as or smaller than the semiconductor laminate constituting one unit to be mounted easily in the proper location.

In this step, if the terminal substrate has one straight side or is quadrangle in plan view, the terminal substrate may be mounted so as to coincide with (lie in the same plane as) at least one side of the semiconductor laminate, for example. This can be easily used for a side view type.

In step (3), a plurality of terminal substrates and a plurality of semiconductor laminates are fixed with a fixing member. The fixing here is preferably one or more of (a) a step of covering the side faces of the terminal substrate with the fixing member, (b) a step of covering the side faces of the semiconductor laminate with the fixing member, and (c) a step of covering the space between the semiconductor laminate and the terminal substrate with the fixing member.

To fix these side faces/spaces with the fixing member (that is, to cover or embed them), any method known in this field may be used, such as coating, potting, printing, compression molding, transfer molding, or spin coating of the fixing member. These methods can be utilized to cover, fix, or embed the side faces of the terminal substrates and the side faces of the semiconductor laminates, as well as the spaces between the semiconductor laminates and the terminal substrates, all at once. One or more of the steps (a), (b), and (c) can be executed as needed by setting the conditions of these methods.

The fixing member may be formed so as to lie in the same plane as the rear face of the terminal substrate. For instance, in transfer molding, the semiconductor laminates may be facing down and disposed so as to embed the rear face of the terminal substrate on a parting sheet, after which the fixing member is formed. This allows the rear face of the terminal substrate to be exposed from the fixing member.

Also, the fixing member may be provided so as to expose the insulator layer in addition to the terminals of the terminal substrate.

The fixing member may be formed thick enough to embed the entire terminal substrate. This increases the overall strength of the light emitting device. As a result, this is advantageous in the support removal step. It is also advantageous in terms for the individual light emitting devices after separation.

The fixing member may also be subjected to removal by dry or wet blasting, to thickness-control by grinding (using a method such as surface planarizing), or to dice, either during the process or prior to the separation of the individual pieces. This allows the desired terminals of the terminal substrates to be easily exposed.

Figure 8A:
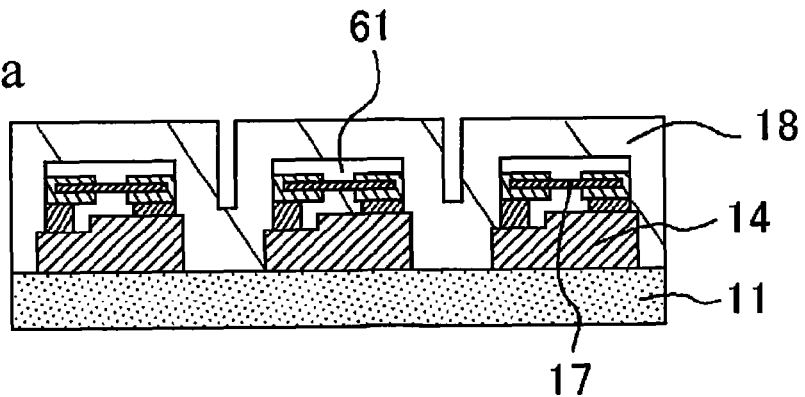
FIGS. 8A and 8B consist of simplified cross sectional step diagrams of another manufacturing process for the light emitting device of the present invention.
Figure 8B:
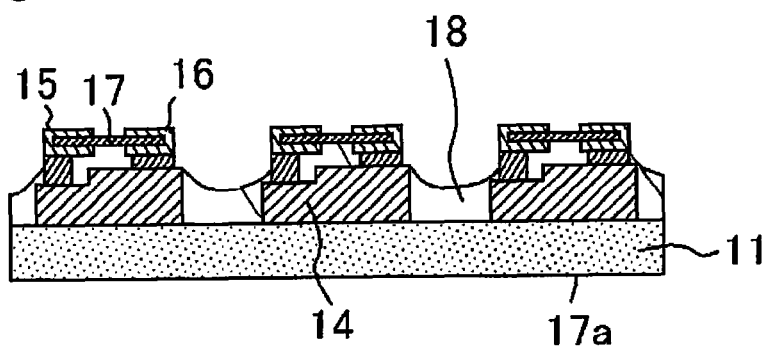

For example, as shown in FIG. 8A, a fixing member 18 is compression molded so as to completely embed the terminal substrates having masks 61 formed on their surface, and is half-diced (parts of the fixing member 18 between the terminal substrates are removed) from the side near the terminal substrate. After this, as shown in FIG. 8B, the fixing member 18 is removed until the terminals 15 and 16 are exposed by wet blasting, which allows the side faces of the terminal substrates to be easily exposed, and allows a light emitting device with side face emission to be manufactured.

After step (3), in step (4), the support is removed from the semiconductor laminates. This removal includes both peeling the individual semiconductor laminates from the above-mentioned adhesive tape or the like, and peeling away the substrate used to grow the semiconductor layer.

In particular, since the semiconductor laminates are securely affixed to the substrate used to grow the semiconductor layer, this substrate can be easily and reliably removed by performing the fixing with the fixing member in step (3).

The removal of the substrate in this case can be easily accomplished by shining a laser beam between the substrate and the semiconductor laminate.

For example, if the semiconductor laminate is a GaN-based semiconductor and the support is a sapphire substrate, the substrate can be removed by irradiating a KrF excimer laser with a wavelength of 248 nm or a quarter-wavelength YAG laser with a wavelength of 266 nm, or the like from the surface of the support, causing the semiconductor layer that constitute a part of the semiconductor laminate to absorb this energy, and thereby bring about ablation. The laser beam irradiation amount, duration, and so forth can be suitably adjusted as dictated by the type of substrate being used, the thickness, and so on.

After removal, any conductive materials, oxides, or the like remaining on the surface (such as Ga metal, Ga2O3, etc.) are removed with HCl, HNO3, or another such acid to form a clean surface. After this, the semiconductor layer is etched with NaOH, TMAH (tetramethylammonium hydroxide), or another such strong alkali to roughen the surface, which improves the light extraction efficiency.

The semiconductor laminate thus etched is more susceptible to the effects of heat and moisture, so a protective film is preferably formed on its surface. Examples of the protective film include a single-layer or a laminated structure of a transparent insulating, that is, a transparent oxide such as $SiO_2$, $Al_2O_3$, $TiO_2$, $Nb_2O_5$, $ZrO_2$ or the like, a transparent nitride such as $AlO_xN_y$, SiN, $SiN_x$ or the like. The protective film can be formed by a spattering method, deposition, ALD (atomic layer deposition), or various film formation methods. A particularly dense film can be formed by ALD, so this is preferable in terms of improving the reliability of the light emitting device. This protective film is not limited to provide on the surface of the semiconductor layer, and can be provided so as to cover the terminal substrate, the sealing member, the wavelength conversion member, and various other members. This affords a light emitting device with high light extraction efficiency.

The removal of the support can also be accomplished by surface planarizing, etching, blasting, or other such polishing.

In step (5), the fixing members between the semiconductor laminates, and if needed, the wavelength conversion members, are cut, etc., to obtain individual pieces.

The cutting position here may be at every semiconductor laminate, or at every two or more semiconductor laminates. The cutting can be accomplished with a blade, a laser, a scriber, etc. If the support was removed from the semiconductor laminate in the previous step, there will be no need to cut the support, so the cutting can be performed at a higher yield, and better mass production will result. Also, mass production can be improved by cutting the fixing member rather than the terminal substrate to which the semiconductor laminate is joined, as with a conventional light emitting device.

The support, the semiconductor laminate, and the fixing member may each be cut by a separate means. For instance, if the support is a sapphire substrate, processing for cleavage with a laser may be performed from the surface of the support the support being broken into individual units, and the fixing member then diced.

If a side view type of light emitting device is to be obtained, for example, and if the portion of the terminals that will become the external connectors is embedded in the fixing member, it is preferable for the external connectors of the terminals to be exposed ahead of time (prior to cutting) by wet or dry etching, blasting, etc.

The wavelength conversion member may be formed on the surface of the semiconductor laminate and/or the surface of the fixing member prior to performing step (5).

The wavelength conversion member is formed, for example, by a method in which a fluorescent material, a resin, and an organic solvent (optionally a diffusion material, etc.) are mixed, and this mixture is sprayed onto the surface of the semiconductor laminate in a number of coats, or a method in which the mixture is applied some other way. Using a spray method affords greater latitude in the layout, shape, etc., of the wavelength conversion member.

A sealing member containing no fluorescent material may be provided over the resulting wavelength conversion member, or an optical member such as a lens or a nanolens may be provided. The sealing member, optical member, etc., can be formed from resin, glass, or the like.

Alternatively, a wavelength conversion member that has been previously formed in a flat shape, a lens shape, etc., may be disposed so as to cover all or part of the semiconductor laminate. This gives a brighter light emitting device.

The light emitting device of the present disclosure, and a method for manufacturing the same, will now be described in detail through reference to the drawings.

Embodiment 1

Light Emitting Device

Figure 1B:
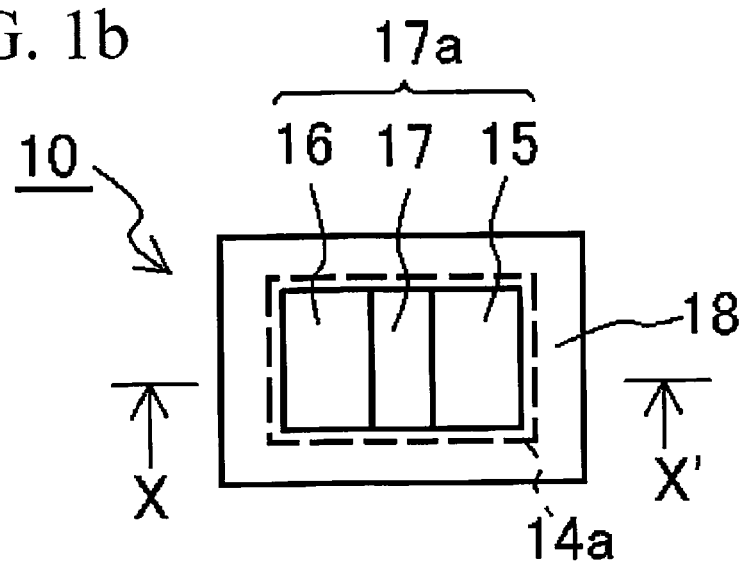

As shown in the cross section of FIG. 1A and the bottom view of FIG. 1B, the light emitting device 10 in Embodiment 1 includes a semiconductor laminate 14a to be a light emitting element having a substantially quadrangle semiconductor laminate layer 14 having a first semiconductor layer, a light emitting layer, and a second semiconductor layer laminated in that order, and a first electrode 12 and a second electrode 13 connected to the semiconductor laminate 14; and a terminal substrate 17a that includes a pair of terminals 15 and 16 and an insulator layer 17.

The terminal substrate 17a includes the insulator layer 17, which is substantially quadrangle and is composed of a zinc oxide ceramic, and the pair of terminals 15 and 16 that go from the element junction face, through different side faces, and to the rear face. This terminal substrate 17a has a varistor function.

The first electrode 12 and the second electrode 13 are respectively electrically connected to the first semiconductor layer, which is an n-type semiconductor layer, and the second semiconductor layer, which is a p-type semiconductor layer, part of the first electrode 12 also goes through an insulating film (such as $SiO_2$) to reach above of the second semiconductor layer. The faces of the first electrode 12 and the second electrode 13 that are joined with the terminal substrate 17a have substantially the same surface area, and lie in substantially the same plane.

The first electrode 12 and the second electrode 13 are respectively joined to the junction terminals of the terminals 15 and 16 of the terminal substrate 17a by eutectic solder (Au—Sn) so that the light extraction face of the semiconductor laminate 14a and the rear face of the terminal substrate 17a lie in substantially parallel.

The terminal substrate 17a is disposed so that its entire outer periphery is more to the inside than the outer periphery of the semiconductor laminate 14a (see FIG. 1B in particular).

The area from the side faces of the semiconductor laminate 14a to the side faces of the terminal substrate 17a is covered by a fixing member 18 composed of silicone resin (SMC, containing 30 wt % silicon dioxide as a filler and 30 wt % titanium dioxide as a reflective material (diffusing material)). The distance between the side faces of the semiconductor laminate 14a and the surface of the fixing member 18 may be about 10 to 200 for example, 150 μm. The distance between the side faces of the terminal substrate 17a and the surface of the fixing member 18 may be about 20 to 250 for example, 200 μm. The fixing member 18 is also disposed between the semiconductor laminate 14 and the fixing member 18.

A wavelength conversion member 19 is disposed from the surface of the first semiconductor layer of the semiconductor laminate 14a to the surface of the fixing member 18. The wavelength conversion member 19 is in the form of a sheet composed of a silicone resin containing about 30 wt % YAG fluorescent material. This light emitting device is such that terminal substrates made into units are individually disposed for semiconductor laminates that serve as individually arranged light emitting elements, which gives a light emitting device that is properly aligned. Also, a so-called chip-size package can be realized. In addition, the mounting substrate itself can be made substantially smaller than the size of the semiconductor laminate, which makes it possible to obtain a more compact package.

Furthermore, with a conventional light emitting element, the substrate that was used to grow the semiconductor layer, such as a sapphire substrate, was used directly as the substrate for the light emitting element. When this substrate is removed, the light absorption, internal scattering, confinement, and so forth caused by this substrate can be prevented, which raises the light extraction efficiency even more and affords greater brightness.

When a structure having the function of a varistor, etc., is used as the terminal substrate, this function can be manifested without installing any separate functional element. As a result, a light emitting device can be obtained that maintains is smaller size while offering higher quality.

Embodiment 2

Method for Manufacturing Light Emitting Device

The light emitting device 10 shown in FIGS. 1A and 1B can be manufactured by the following method.

Figure 2A:
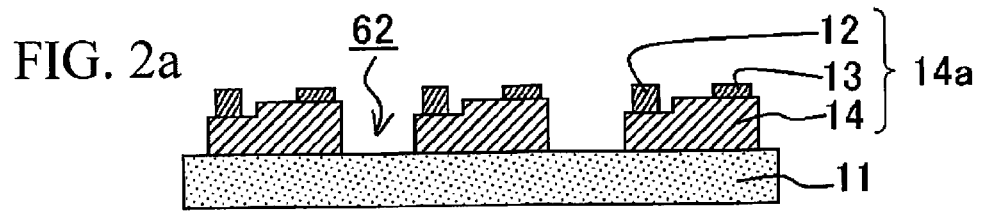
FIGS. 2A to 2F consist of simplified cross sectional step diagrams of the manufacturing process for the light emitting device of the present invention.

First, as shown in FIG. 2A, the semiconductor laminate 14 (in which the first semiconductor layer, the light emitting layer, and the second semiconductor layer are laminated) is formed on a sapphire substrate 11. The semiconductor laminate 14 have part of the second semiconductor layer and the light emitting element removed to expose part of the first semiconductor layer. Also, the semiconductor laminate 14 are separated by a separation groove 62 that exposes the surface of the sapphire substrate 11, in units that function as the light emitting element of one chip.

With the semiconductor laminate 14, the first electrode 12 and the second electrode 13 are formed on the exposed first semiconductor layer and on the second semiconductor layer. Electrodes can be formed by utilizing a known method. This forms the semiconductor laminates 14a to be a light emitting element.

Figure 2B:
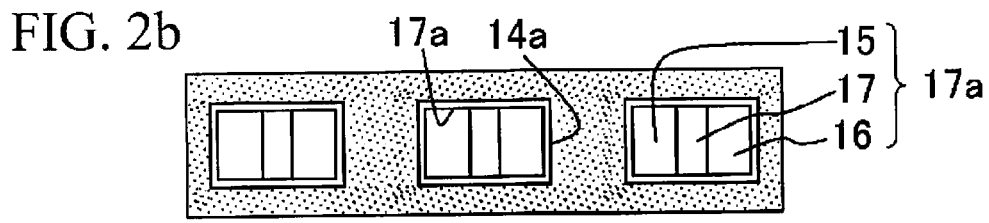
Figure 2C:
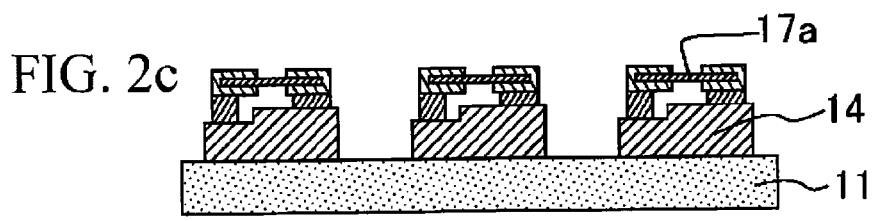

As shown in FIG. 2B (the top view) and FIG. 2C (the cross-section), the terminal substrates 17a are mounted on the individual semiconductor laminates 14a so that the first electrode 12 and the second electrode 13 of the semiconductor laminate 14a arranged on the sapphire substrate 11 will be joined with the junction terminals of the terminals 15 and 16. The outer edge of the terminal substrate 17a here is disposed more to the inside than the outer edge of the semiconductor laminate 14a (see FIG. 2B in particular).

Figure 2D:
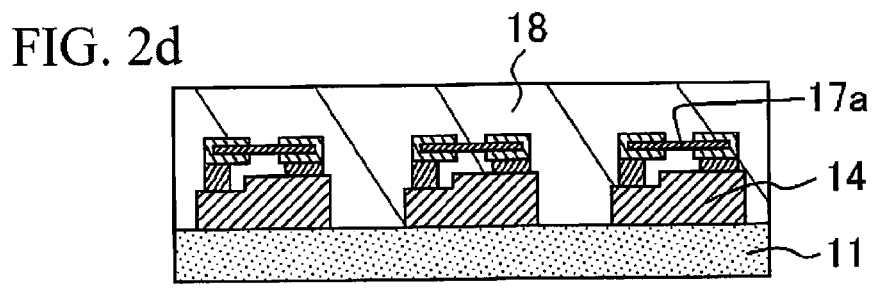

As shown in FIG. 2D, the fixing member 18 coating is applied so as to cover the entire terminal substrates 17a and the side faces of the semiconductor laminates 14a, from the terminal substrates 17a side. The fixing member 18 is also applied between the semiconductor laminates 14a and the terminal substrates 17a.

Alternatively, the semiconductor laminates 14a with sapphire substrate 11 which joined to the terminal substrates 17a are sandwiched between upper and lower molds, then resin is injected into the molds, and the fixing member 18 is disposed between the terminal substrates 17a and the semiconductor laminates 14a, at the side faces of the semiconductor laminates 14a, and over the entire terminal substrates 17a.

Figure 2E:
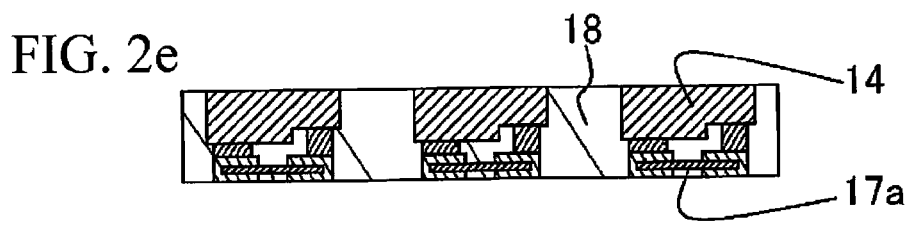

As shown in FIG. 2E, the fixing member 18 is removed from the rear face of the terminal substrates 17a so as to expose the external connectors of the terminals 15 and 16. After this, a KrF excimer laser having a wavelength of 248 nm is irradiated from the surface of the sapphire substrate 11, the energy is absorbed by the semiconductor layer constituting the semiconductor laminates 14a, and ablation is performed, which removes the sapphire substrate 11 and exposes the surface of the first semiconductor layer. This separates the semiconductor laminates 14a for each chip within the fixing member 18.

Gallium metal, $Ga_2O_3$, or other such residue that remains on the surface after removal of the sapphire substrate 11 is removed with HCl to form a clean surface. The semiconductor layer is then roughened by etching with NaOH.

Figure 2F:
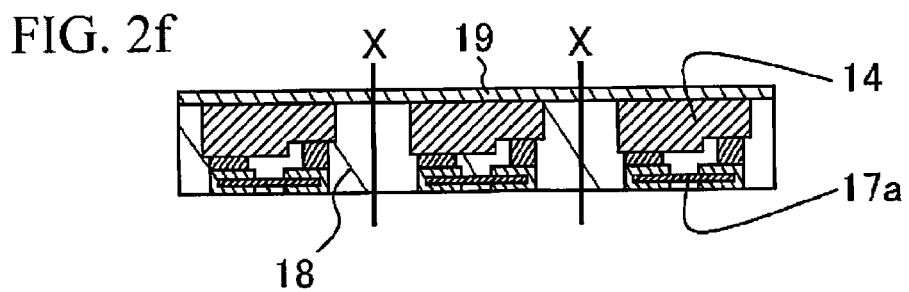

As shown in FIG. 2F, the wavelength conversion member 19 covers the surface of the exposed first semiconductor layer. The wavelength conversion member 19 here also covers the surface of the fixing member 18 disposed to the side of the first semiconductor layer.

After this, the wavelength conversion member 19 and the fixing member 18 are cut along the X line in FIG. 2F for each of the semiconductor laminates 14a. This gives the light emitting device 10 shown in FIGS. 1A and 1B.

Since terminal substrates that have been made into units already provided with terminals can thus be disposed on the individual semiconductor laminates, the yield is better than when the terminals are formed by plating growth or the like, and since alignment is easier than when mounting a substrate group, mass production can be improved.

Also, when the individual semiconductor laminates are covered by fixing members, the stress produced in removing the substrate used to growth the semiconductor layer can be reduced according to the size of the semiconductor laminates. Thus, the substrate can be easily removed without damaging the semiconductor laminates. This results in a higher yield.

When the semiconductor laminates are cut after the substrate has thus been removed, they can be made into units without cutting the substrate, so this contributes to even better mass production.

Embodiment 3

Light Emitting Device

Figure 3:
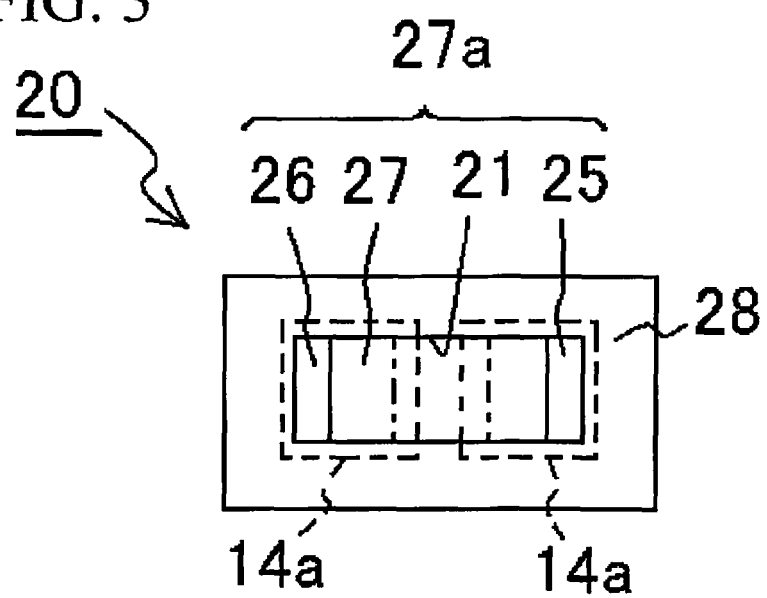
FIG. 3 is a bottom view of another embodiment of the light emitting device of the present invention.

As shown in the bottom view of FIG. 3, the light emitting device 20 in Embodiment 3 includes two semiconductor laminates 14a having a substantially quadrangle semiconductor layer having a first semiconductor layer, a light emitting layer, and a second semiconductor layer laminated in that order, and a first electrode 12 and a second electrode 13 connected to the semiconductor layer 14; and a terminal substrate 27a.

The terminal substrate 27a includes an insulator layer 27, a pair of terminals 25 and 26 that go from the element junction face, through different side faces, and to the rear face, and a wiring-use terminal 21 that is separated from the terminals 25 and 26 and located between them at the element junction face.

The first electrode of the one semiconductor laminate 14a is serially connected to the terminal 25 of the terminal substrate 27a, the second electrode of the other semiconductor laminate 14a to the terminal 26 of the terminal substrate 27a, and the second electrode of the one semiconductor laminate 14a and the first electrode of the other semiconductor laminate 14a to the wiring-use terminal 21.

The terminal substrate 27a is disposed more to the inside than the outer periphery on three sides of the each semiconductor laminate 14a, and is disposed straddling one side opposite each semiconductor laminates 14a in plan view.

Thus, except for the fact that a fixing member 28 and a wavelength conversion member are cut for every two semiconductor laminates 14a, the configuration is substantially the same as in the light emitting device 10 in Embodiment 1, and can be manufactured by the same method as in Embodiment 2.

This light emitting device has the same effect as the light emitting device 10 in Embodiment 1 and the manufacturing method in Embodiment 2.

Embodiment 4

Light Emitting Device

Figure 4A:
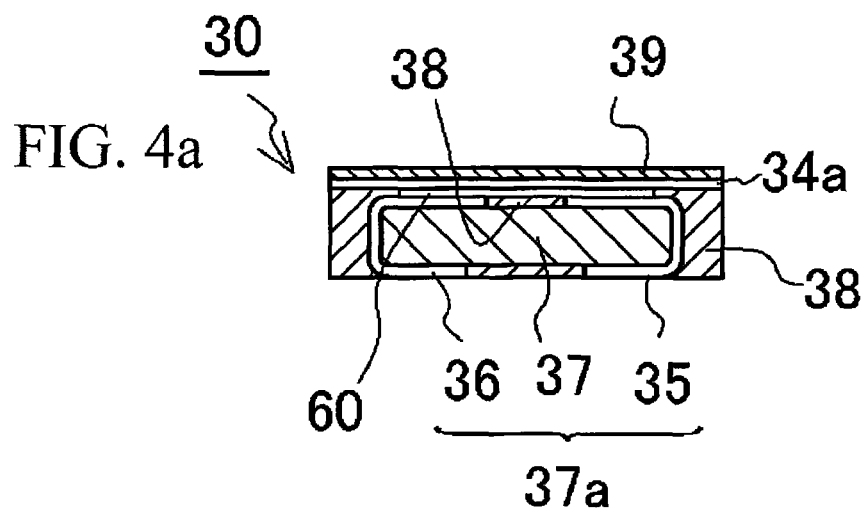
FIG. 4A consists of a simplified cross section and FIG. 4B consists of a bottom view of yet another embodiment of the light emitting device of the present invention.
Figure 4B:
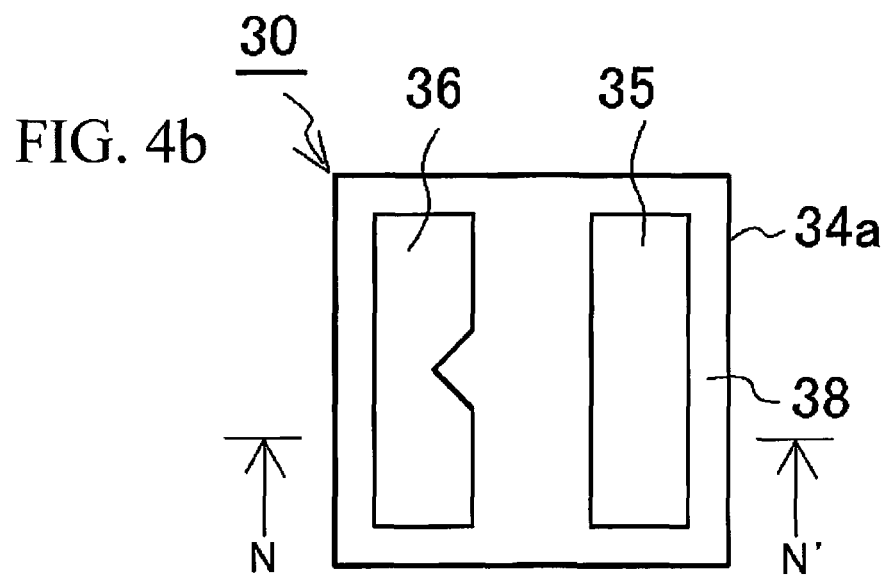

As shown in the cross section (along the N-N' line in FIG. 4B) of FIG. 4A and the bottom view of FIG. 4B, the light emitting device 30 in Embodiment 4 includes a semiconductor laminate 34a having a substantially quadrangle semiconductor layer including a first semiconductor layer, a light emitting layer, and a second semiconductor layer laminated in that order, and a first electrode and a second electrode connected to the semiconductor layer; and a terminal substrate 37a that includes a pair of terminals 35 and 36 and an insulator layer 37.

The first electrode and second electrode are electrically connected to the terminals 35 and 36 via a junction member 60.

This light emitting device 30 includes a wavelength conversion member 39 on the side of the semiconductor laminate 34a where the electrodes are not provided, that is, on the light extraction face side, and the semiconductor laminate 34a and the wavelength conversion member 39 are substantially the same in size and shape. A fixing member 38 covers only the first electrode and second electrode portions of the semiconductor laminate 34a, and does not cover the side faces of the semiconductor layer.

One terminal 36 of the terminal substrate is provided in a rectangular shape having a cutout in the approximate center of the side opposite the other terminal 35, as an external connector on the rear face of the terminal substrate. The other terminal 35 is provided in a rectangular shape having no cutout, and is shaped differently from the one terminal 35. Thus using different shapes for the external connectors of the pair of terminals makes it easy to determine the polarity of the light emitting device.

Otherwise, the configuration is substantially the same as that of the light emitting device 10 in Embodiment 1, and can be manufactured by the same method as in Embodiment 2.

This light emitting device has the same effect as the light emitting device 10 in Embodiment 1 and the manufacturing method in Embodiment 2.

Embodiment 5

Light Emitting Device

Figure 5A:
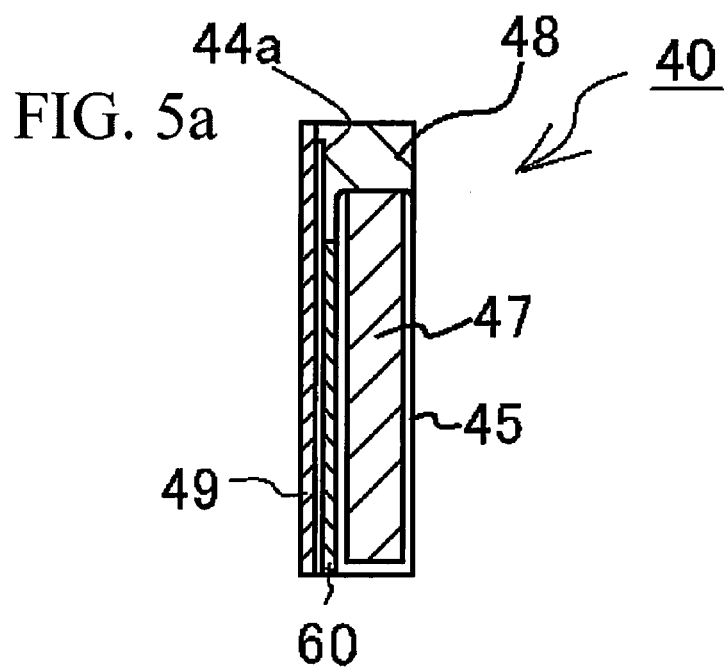
FIG. 5A consists of a simplified cross section and FIG. 5B consists of a bottom view of yet another embodiment of the light emitting device of the present invention.
Figure 5B:
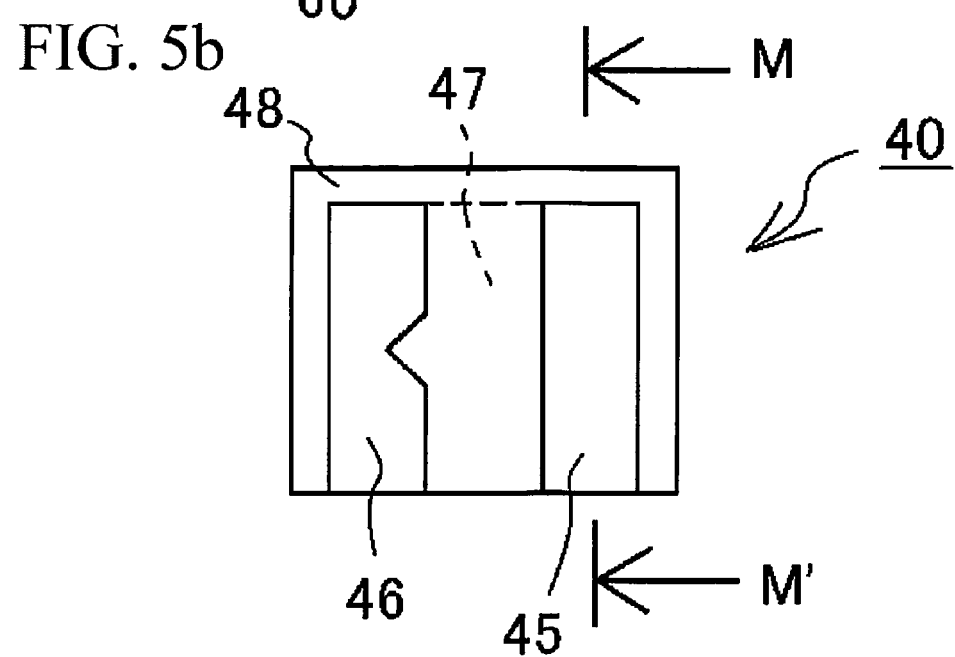

As shown in the cross section (along the M-M' line in FIG. 5B) of FIG. 5A and the bottom view of FIG. 5B, the light emitting device 40 in Embodiment 5 includes a semiconductor laminate 44a having a substantially quadrangle semiconductor layer including a first semiconductor layer, a light emitting layer, and a second semiconductor layer laminated in that order, and a first electrode and a second electrode connected to the semiconductor layer; and a terminal substrate 37a that includes a pair of terminals 45 and 46 and an insulator layer 47.

The first electrode and second electrode are electrically connected to the terminals 45 and 46 via a junction member 60.

This light emitting device 40 includes a wavelength conversion member 49 on the light extraction face of a semiconductor laminate 44a. The semiconductor laminate 44a is smaller than the wavelength conversion member 49.

A fixing member 48 covers the first electrode and second electrode portions of the semiconductor laminate 44a, as well as part of the side faces of the semiconductor layer.

Terminals 45 and 46 on the terminal substrate go from the element junction face of the terminal substrate, through a side face, to the rear face of the terminal substrate. The terminals 45 and 46 are exposed from the fixing member 48 on one side face of the terminal substrate. At this side face, the wavelength conversion member 49, the semiconductor laminate 47a, and the fixing member 48 coincide with and lie in substantially the same plane as the exposed faces of the terminals 45 and 46.

Also, on the rear face of the terminal substrate, the surface of an insulator layer 47 is covered by the fixing member 48.

The other configurations are substantially the same as in the light emitting devices 10 and 30 in Embodiments 1 and 4, and can be manufactured by the same method as in Embodiment 2.

This light emitting device has the same effect as the light emitting devices 10 and 30 in Embodiments 1 and 4, and as the manufacturing method in Embodiment 2.

Since the terminals of the terminal substrate 47a are exposed at the side face of the light emitting device as well, this embodiment can be used as a side view type of light emitting device.

Embodiment 6

Light Emitting Device

As shown in FIGS. 6A to 6E, the light emitting device 50 in Embodiment 6 includes a semiconductor laminate 54a having a substantially rectangular-shape semiconductor layer including a first semiconductor layer, a light emitting layer, and a second semiconductor layer laminated in that order, and a first electrode and a second electrode connected to the semiconductor layer; and a terminal substrate 57a that includes a pair of terminals 55 and 56 and an insulator layer 57.

This light emitting device 50 includes a wavelength conversion member 59 on the light extraction face of a semiconductor laminate 54a. The semiconductor laminate 54a is smaller than the wavelength conversion member 59.

A fixing member 58 covers entire side faces of semiconductor laminate 54a, and a wavelength conversion member 59 covers the upper faces of both the semiconductor laminate 54a and the fixing member 58. Consequently, the entire side faces of the semiconductor laminate 54a can be reinforced by the fixing member 58, and higher strength can be ensured for the light emitting device. Also, the fixing member 58 is sloped at the face touching the terminals exposed on the side face of the terminal substrate. This allows the mounting solder used for joining to terminal parts 56aa to effectively accumulate at this sloped portion.

Figure 6A:
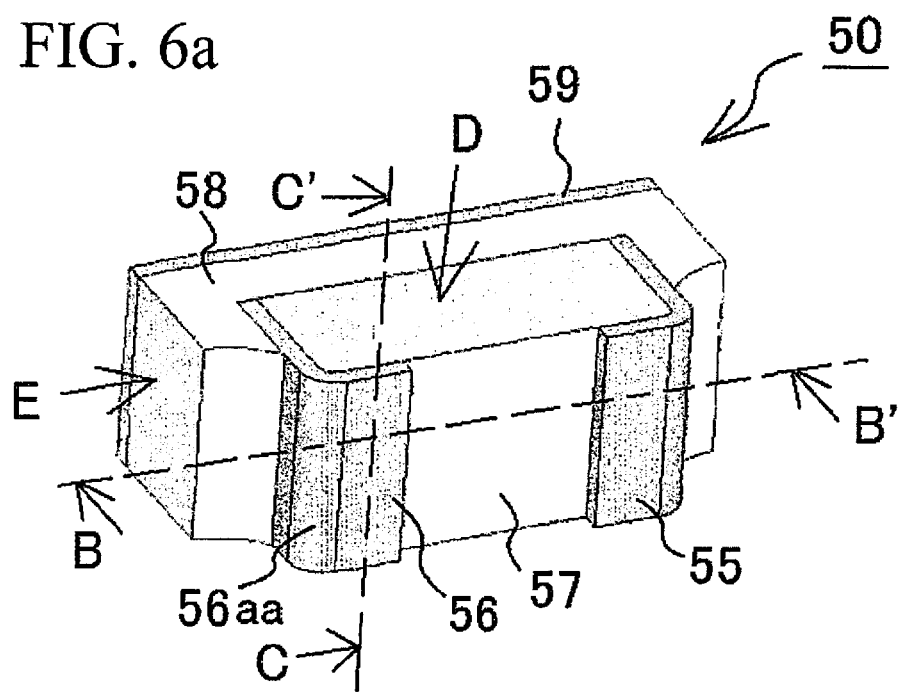
FIG. 6A consists of a simplified oblique view, FIG. 6B consists of a B-B' cross section, FIG. 6C consists of a C-C' cross section, FIG. 6D consists of a lateral side view in the direction of the arrow D, and FIG. 6E consists of a vertical side view in the direction of the arrow E of yet another embodiment of the light emitting device of the present invention.
Figure 6B:
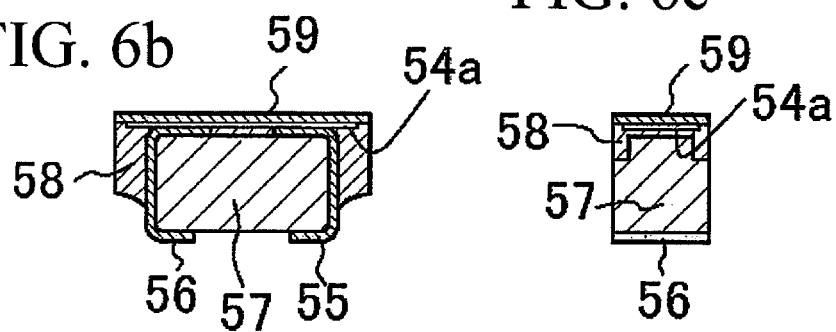
Figure 6C:
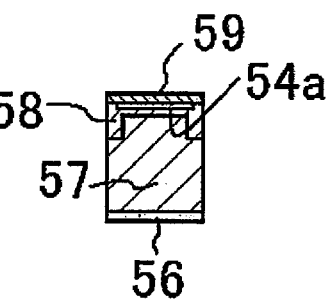
Figure 6D:
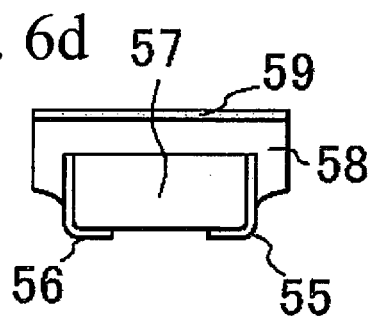
Figure 6E:
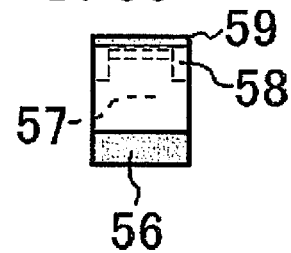

As shown in FIGS. 6C and 6E, an insulator layer 57 of the terminal substrate has a convex shape on the side close to semiconductor laminate 54a, as seen from the side face. Consequently, the portion insulator layer 57 of the terminal substrate that is close to the semiconductor laminate is narrower than on the opposite side, which reduces the amount of fixing member that is removed in the blasting, etc., performed before and after the step in FIG. 2F, so the processing can be simpler. Also, a snugger fit is achieved by embedding the convex part in the fixing member 58.

The terminals 55 and 56 go from the element junction face side of the terminal substrate, through a pair of side faces, to the rear face. They are exposed from the fixing member 58 near the rear face side of the pair of side faces and the rear face of the terminal substrate. That is, the terminals 55 and 56 are covered by the fixing member 58 at the portion close to the semiconductor laminate 54a on the pair of side faces, and not covered at the portion close to the rear face side on the pair of side faces. This allows both of the terminals 55 and 56 exposed at the side faces and the rear face side of the terminal substrate to be used as external connectors.

Also, the wavelength conversion member 59 and the fixing member 58 lie in substantially the same plane on another pair of side faces different from the pair of side faces where the terminals 55 and 56 of the terminal substrate are exposed (see FIGS. 6C and 6E). This other pair of side faces form the top and bottom faces of the light emitting device, allowing the light emitting device to be used as a side view type. In this case, using both of the terminals 55 and 56 exposed at the side faces and the rear face side of the terminal substrate as external connectors increases the mounting strength of the light emitting device.

With the light emitting device in this embodiment, the reliability of the light emitting device is enhanced by covering the entire side faces of the semiconductor laminate 54*a* with the fixing member 58. In particular, when the light emitting device is used as a side view type in which the semiconductor laminate 54*a* is mounted close to the mounting substrate of the light emitting device, it is possible to prevent the infiltration of flux and the like used in the mounting of the light emitting device.

This light emitting device has the same effect as the light emitting devices 10 and 30 in Embodiments 1 and 4.

As shown in FIG. 2F, with this light emitting device, the terminals of the terminal substrate 57*a* can be exposed by blasting away or otherwise removing the fixing member covering the pair of side faces where the pair of terminals is provided, either before or after the cutting of the wavelength conversion member and the fixing member. The other configurations can be manufactured by the same method as in Embodiment 2.

This light emitting device has the same effect as the light emitting devices 10 and 30 in Embodiments 1 and 4, and the manufacturing method in Embodiment 2.

Embodiment 7

Light Emitting Device

As shown in FIG. 7, the light emitting device 60 in Embodiment 7 is such that terminals 55*a* and 56*a* are exposed on the rear face side of the terminal substrate, and on two pairs of side faces that are connected to the rear face. That is, when the light emitting device is mounted as a side view type, the terminals 55*a* and 56*a* expose a face Q that serves as the bottom face of the light emitting device, a face S that is adjacent to this bottom face, a face P on the opposite side from the face opposite the semiconductor laminate, and a top face T on the opposite side from the mounting face of the light emitting device.

Otherwise, the configuration and effect are substantially the same as those of the light emitting device 50 in Embodiment 6.

Embodiment 8

Light Emitting Device

Figure 9:
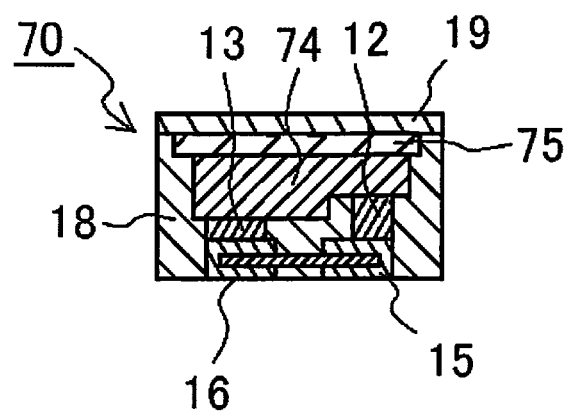
FIG. 9 consists of a simplified cross section of an embodiment of the light emitting device of the present disclosure.

As shown in FIG. 9, the light emitting device 70 in Embodiment 8 is such that a semiconductor laminate 74 has a substrate 75 used to grow the semiconductor layers, the substrate 75 is exposed at part of its surface from the semiconductor laminate 74.

Otherwise, the configuration and effect are substantially the same as those of the light emitting device 10 in Embodiment 1.

INDUSTRIAL APPLICABILITY

The light emitting device according to the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

As illustrated above, embodiments are described to give a concrete form to technical ideas of a light emitting device according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

The invention claimed is:

1. A method of manufacturing a light emitting device comprising:
    mounting a terminal substrate on a light emitting element individually arranged on a support from above the light emitting element with respect to a direction of gravity, with the light emitting element including a semiconductor laminate, which includes a first semiconductor layer, a light emitting layer and a second semiconductor layer laminated in that order on the support, so that at least a part of the outer edge of the terminal substrate is disposed more to the inside than the outer edge of the first semiconductor layer of the light emitting element in plan view.

2. The method of manufacturing a light emitting device according to claim 1, further comprising:
    prior to the mounting of the terminal substrate, individually arranging on the support a plurality of the light emitting elements such that the semiconductor laminates of adjacent ones of the light emitting elements are separated from each other; and
    the mounting of the terminal substrate includes individually mounting a plurality of the terminal substrates respectively on the light emitting elements individually arranged on the support so that the outer edge of each of the terminal substrates is disposed more to the inside than the outer edge of the first semiconductor layer of a corresponding one of the light emitting elements in plan view.

3. The method of manufacturing a light emitting device according to claim 2, wherein:
    the support is a substrate used to grow the semiconductor laminate.

4. The method of manufacturing a light emitting device according to claim 1, further comprising:
    covering the side faces of the terminal substrate with a fixing member.

5. The method of manufacturing a light emitting device according to claim 1, further comprising:
    covering a space between the light emitting element and the terminal substrate with a fixing member.

6. The method of manufacturing a light emitting device according to claim 1, further comprising:
    forming a wavelength conversion member on the semiconductor laminate and a fixing member.

7. The method of manufacturing a light emitting device according to claim 1, wherein
    the mounting of the terminal substrate on the light emitting element includes mounting the terminal substrate on the light emitting element, which further includes a first electrode including a protrusion portion and a second electrode including a protrusion portion.

8. The method of manufacturing a light emitting device according to claim 7, wherein
    the mounting of the terminal substrate on the light emitting element includes mounting the terminal substrate including a pair of terminals each having a protrusion portion so that the terminals of the terminal substrate are respectively connected to the protrusion portion of the first electrode and the protrusion portion of the second electrode.

9. The method of manufacturing a light emitting device according to claim 8, wherein
the protrusion portion of each of the terminals is formed by disposing a bump on a flat surface of the terminal, disposing an insulator having a different thickness under the terminal, disposing the terminal having a different thickness on a flat insulator, or by combination thereof.

10. The method of manufacturing a light emitting device according to claim 7, wherein
each of the protrusion portion of the first electrode and the protrusion portion of the second electrode protrudes from an upper surface of a corresponding one of the first electrode and the second electrode in which the protrusion portion is not disposed by a height equal to or less than 100 micro meters.

11. The method of manufacturing a light emitting device according to claim 8, wherein
the protrusion portion of each of the terminals protrudes from an upper surface of the terminal in which the protrusion portion is not disposed by a height equal to or less than 100 micro meters.

12. The method of manufacturing a light emitting device according to claim 3, further comprising:
covering the side faces of the terminal substrate with a fixing member.

13. The method of manufacturing a light emitting device according to claim 12, further comprising:
covering a space between the light emitting element and the terminal substrate with a fixing member.

14. The method of manufacturing a light emitting device according to claim 3, further comprising:
fixing the plurality of the terminal substrates and the plurality of the light emitting elements with a fixing member;
removing the support from the light emitting elements; and
separating the fixing member between the semiconductor laminates at every one or more light emitting elements.

15. The method of manufacturing a light emitting device according to claim 3, further comprising:
forming a wavelength conversion member on the semiconductor laminate and a fixing member.

16. The method of manufacturing a light emitting device according to claim 12 further comprising:
separating the fixing member between the semiconductor laminates at every one or more light emitting elements, and
the separating of the fixing member is performed by cutting the fixing member.

17. The method of manufacturing a light emitting device according to claim 3, wherein
the mounting of the terminal substrate on the light emitting element includes mounting the terminal substrate on the light emitting element, which further includes a first electrode including a protrusion portion and a second electrode including a protrusion portion.

18. A method of manufacturing a light emitting device comprising:
individually arranging on a support a plurality of light emitting elements each including a semiconductor laminate such that the semiconductor laminates of adjacent ones of the light emitting elements are separated from each other, each of the semiconductor laminates including a first semiconductor layer, a light emitting layer and a second semiconductor layer laminated in that order on the support;
individually mounting a plurality of terminal substrates respectively on the light emitting elements individually arranged on the support so that an outer edge of each of the terminal substrates is disposed more to the inside than an outer edge of the first semiconductor layer of a corresponding one of the light emitting elements in plan view;
fixing the plurality of the terminal substrates and the plurality of the light emitting elements with a fixing member so that the fixing member fills between adjacent ones of the semiconductor laminates and between adjacent ones of the terminal substrates;
removing the support from the light emitting elements; and
separating the fixing member between the semiconductor laminates and between the terminal substrates at every one or more light emitting elements.

19. The method of manufacturing a light emitting device according to claim 18, further comprising:
the separating of the fixing member is performed by cutting the fixing member.

* * * * *